(12) United States Patent
Warwick et al.

(10) Patent No.: US 10,257,930 B2
(45) Date of Patent: Apr. 9, 2019

(54) TRACE ANYWHERE INTERCONNECT

(71) Applicant: R&D CIRCUITS, INC., South Plainfield, NJ (US)

(72) Inventors: Thomas P Warwick, Melbourne, FL (US); Dhananjaya Trupuseema, Whitehouse Station, NJ (US); James V Russell, Basking Ridge, NJ (US)

(73) Assignee: R&D Circuits, Inc., South Plainfield, NJ (US)

( * ) Notice: Subject to any disclaimer, the term of this patent is extended or adjusted under 35 U.S.C. 154(b) by 0 days.

(21) Appl. No.: 15/189,435

(22) Filed: Jun. 22, 2016

(65) Prior Publication Data

US 2017/0374739 A1    Dec. 28, 2017

(51) Int. Cl.
| | |
|---|---|
| *H01R 43/00* | (2006.01) |
| *H05K 1/11* | (2006.01) |
| *H05K 3/40* | (2006.01) |
| *H05K 3/10* | (2006.01) |
| *H05K 3/32* | (2006.01) |
| *H05K 1/09* | (2006.01) |
| *H05K 1/02* | (2006.01) |
| *H05K 1/18* | (2006.01) |

(52) U.S. Cl.
CPC .......... *H05K 1/111* (2013.01); *H05K 1/0296* (2013.01); *H05K 1/09* (2013.01); *H05K 1/118* (2013.01); *H05K 1/18* (2013.01); *H05K 3/10* (2013.01); *H05K 3/32* (2013.01); *H05K 3/4007* (2013.01); *H05K 3/4038* (2013.01); *H05K 2201/1003* (2013.01); *H05K 2201/10015* (2013.01); *H05K 2201/10022* (2013.01); *Y10T 29/49117* (2015.01)

(58) Field of Classification Search
CPC ......... Y10T 29/49117; Y10T 29/49123; Y10T 29/49167; Y10T 29/49155; Y10T 29/49162; Y10S 428/901; H01B 13/016; H01B 13/00
USPC .................. 29/825, 846, 850, 854, 856, 860
See application file for complete search history.

(56) References Cited

U.S. PATENT DOCUMENTS 6,843,657 B2 *  1/2005  Driscoll ............... H01R 23/688
                                                        439/289

* cited by examiner

*Primary Examiner* — Thiem D Phan
(74) *Attorney, Agent, or Firm* — Richard B. Klar, Esq.; Law Office Richard B. Klar

(57) ABSTRACT

The present invention provides for a method and structure for forming three-dimensionally routed dielectric wires between discrete points on the two or more parallel circuit planes. The wires may be freely routed in three-dimensional space as to create the most efficient routing between the two arbitrarily defined points on the two or more parallel circuit planes. Metalizing the outer surfaces of these three dimensional dielectric wires electrically coupling the discrete wires to their respective discrete contact points. Two or more of these wires may be in intimate contact to one another electrically coupling to each other as well as to two or more discrete contact pads. These electrically coupled contact pads may be on opposite sides or on the same side of the structure and the formed metalized wires may originate on one side and terminate on the other or originate and terminate from the same side.

36 Claims, 14 Drawing Sheets

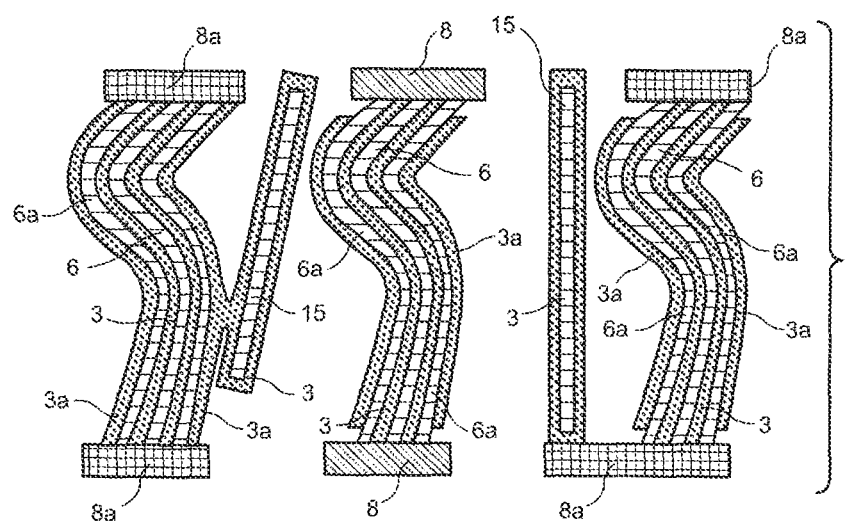
F I G. 5a
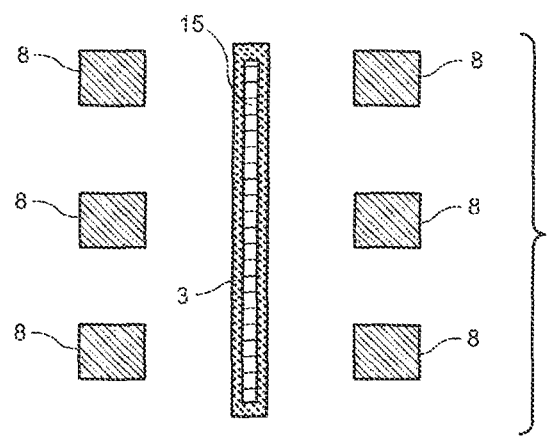
F I G. 5b

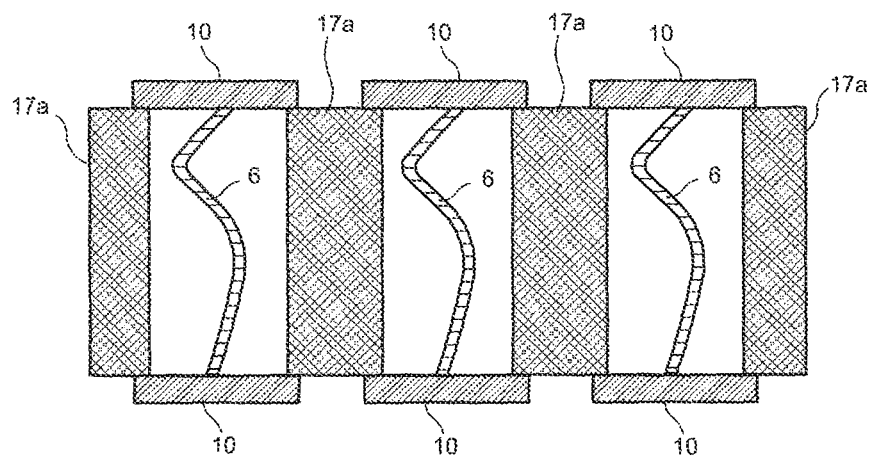
F I G. 10

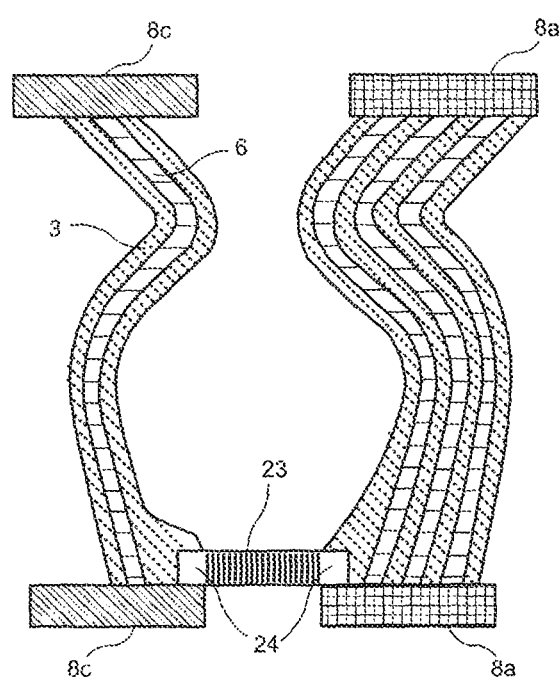
F I G. 13

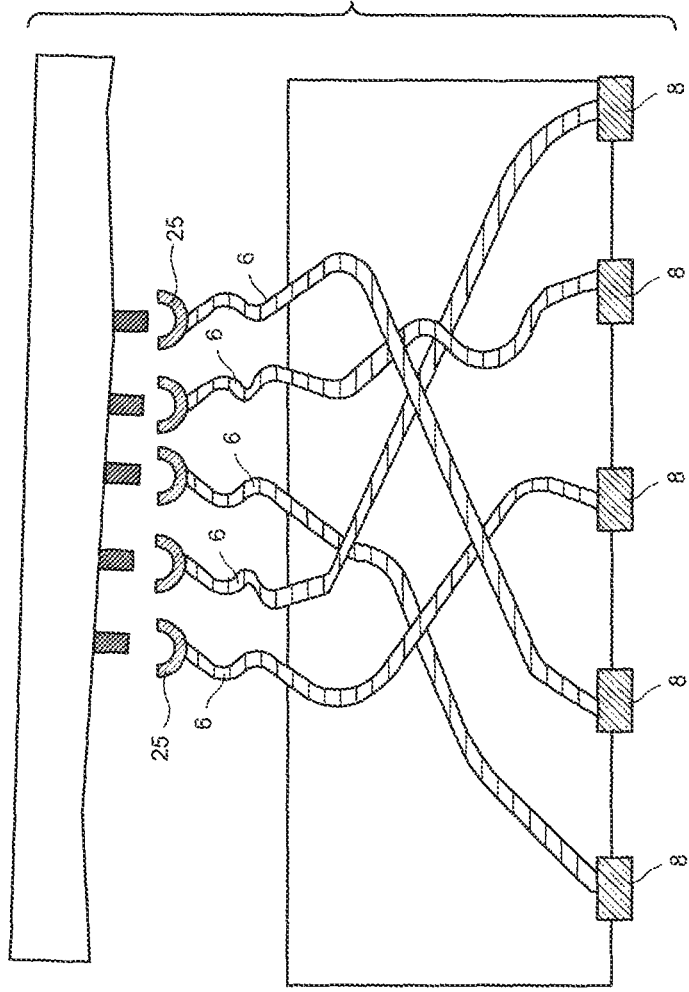

TRACE ANYWHERE INTERCONNECT

BACKGROUND

1. Field

The present application relates to a method and a structure for creating interconnects that are not bound by the limitations of conventional interconnect technology. In particular the present invention relates to forming an electrical interconnect mechanism between two or more discrete contact points such as but not limited to circuit pads within two or more parallel circuit planes with circuitry formed in three-dimensional space between the aforementioned two or more circuit planes in order to allow for electrical coupling of two or more electrical devises through said interconnect device.

2. The Related Art

Conventional interconnect technology limits the routing of circuitry to the x-y plane by way of conductive traces. These traces are then connected in the z-axis through holes (vias) formed perpendicular to the traces, aligned over the traces. These vias are then coated or plated with a metallization either partially or completely filled connecting the traces to circuitry formed in the x-y planes above and below.

It is normal for these interconnect structures to have an array of contact pads on either side of the outer major surfaces of the structure and occasionally even on the minor sides or surfaces of the structure. These contact pads are meant to be electrically coupled with electronic components on the outer surfaces. When there are a large number of contact pads or points on each side to be electrically coupled the internal circuitry layers become very dense and require a large number of routing layers. Each of these layers are traditionally formed in layer pairs of two, sandwiched on both sides of a dielectric sheet. These sheets are manufactures concurrently then bonded together with additional dielectric sheet layers forming multilayered structures. Vias are then formed and metalized through or partially through these layer stacks making the required z axis interconnects. Partial or buried vias can be formed and metalized on each of the layer pairs prior to bonding the layers together.

Alternatively, to improve routing density dielectric layers and circuitry layers can be built up one on top of another sequentially with blind vias formed only where necessary. This eliminates the need of through vias, which take up routing space in the x-y planes on layers where the vias is not essential. This via anywhere approach greatly improved routing density but suffers from the cost of time and labor to build these layers sequentially.

SUMMARY

The present invention provides a method and a structure in which an electrical interconnect mechanism is formed having complex connections between two or more discrete contact points such as but not limited to circuit pads within two or more parallel circuit planes with circuitry formed in three-dimensional space between the aforementioned two or more circuit planes. In this way the present invention provides for electrical coupling of two or more electrical devices through said interconnect device.

In particular the present invention provides for a method and structure for forming three-dimensionally routed dielectric wires between discrete points on the two or more parallel circuit planes. These wires may be freely routed in three-dimensional space as to create the most efficient routing between the two arbitrarily defined points on the two or more parallel circuit planes. Metalizing the outer surfaces of these three dimensional dielectric wires electrically coupling the discrete wires to their respective discrete contact points. Two or more of these wires may be in intimate contact to one another electrically coupling to each other as well as to two or more discrete contact pads. These electrically coupled contact pads may be on opposite sides or on the same side of the structure and the formed metalized wires may originate on one side and terminate on the other or originate and terminate from the same side. Optionally, forming a second coating of dielectric on the metalized surfaces of the discrete wires to a specific thickness as to approximate a coaxial wire. These formed and metalized dielectric wire may be electrically coupled through the metallization process to discrete metallic circuits on the two or more planes or the discrete parallel circuits may be formed as an integral part of the formed dielectric wires and then metalized along with the dielectric wires. Other embodiments and variations of the present invention are described below.

BRIEF DESCRIPTION OF THE DRAWINGS

FIGS. 5a and b show alternative embodiments for the present invention;

FIG. 10 is another embodiment for the present invention in which epoxy scaffolding maintains alignment in the X axis and Y axis and z axis locations of each circuit element;

FIG. 11a is another embodiment of the present invention in which the interconnect is provided with a scaffolding of dielectric, dielectric posts or a dielectric block with penetrations for passage of the wires there through;

FIGS. 12a, 12b and 12c show alternative embodiments of the present invention in which:

FIG. 12a shows the lattice work of non-conductive dielectric scaffolding for the present invention with the circuit element proud;

FIG. 12b shows the lattice work of non-conductive dielectric scaffolding for the present invention with an air dielectric;

FIG. 12c shows the lattice work of non-conductive dielectric scaffolding for the present invention with the circuit element flush;

FIG. 13 shows another embodiment of the present invention for affixing and electrically coupling two or more terminal points of a electronic component 23 such as but not limited to resistor, capacitors or inductor to the formed wires and the corresponding circuit elements 10 of the corresponding planes 7 wherein each point to be coupled to its corresponding designated power, ground, or signal wires 6 and or circuit elements 10 in the interconnect structure;

FIG. 14 is another embodiment of the present invention in which the wires 6 are extended beyond the rigid body of the interconnect 1 with spring shapes conducive for flexing such as but not limited to coils, cantilever, S-shapes with end points conducive for contacting various shapes of electrical devices such as but not limited to sharp points, crown tips, cup shapes acting as a compliant interconnect coupling two non-coplanar electrical devices.

DETAILED DESCRIPTION OF THE PREFERRED EMBODIMENTS

Figure 1A:
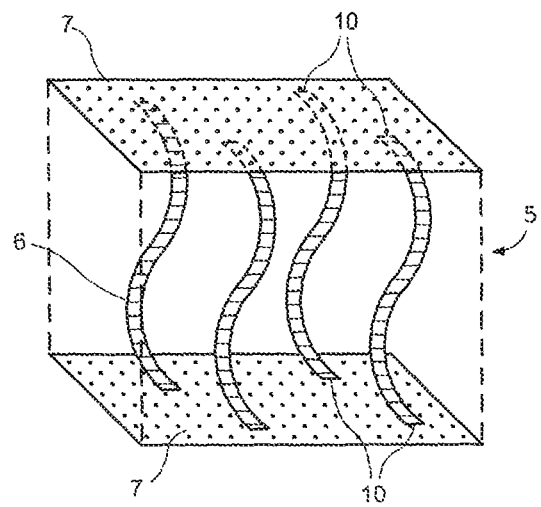
FIG. 1A shows a perspective view of a first embodiment of the present invention.
Figure 1B:
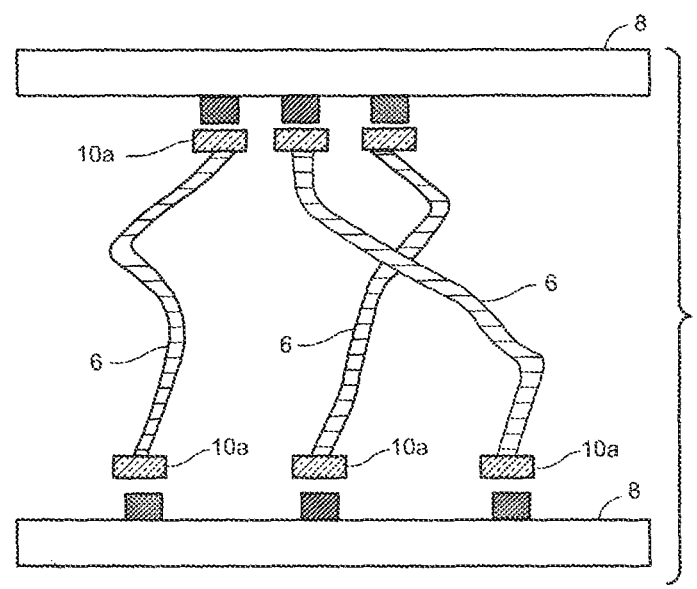
FIG. 1b is a sectional view of FIG. 1A with component or electrical devices added.
Figure 2A:
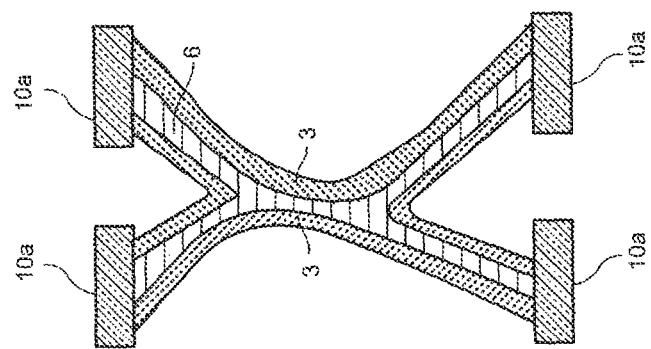
FIGS. 2a-2c are sectional views of three additional embodiments of the present invention of FIG. 1a having metalized outer layers for the dielectric wires and contact points.
Figure 2B:
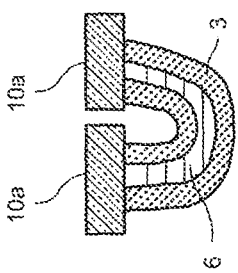
Figure 2C:
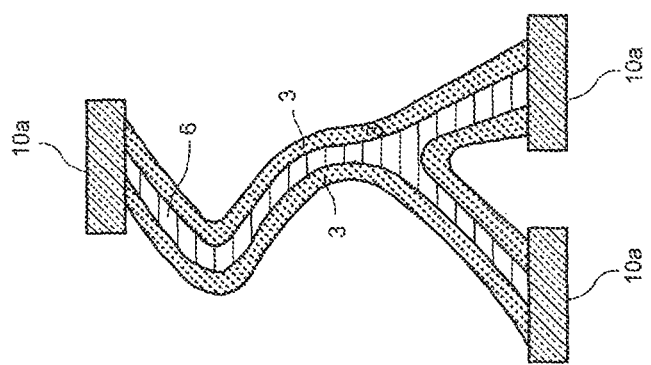
Figure 3D:
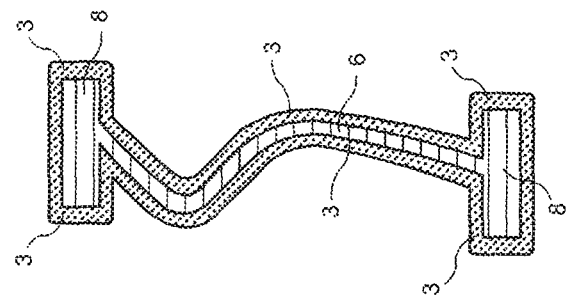
FIGS. 3a-3d show alternative embodiments for the dielectric wires of FIG. 1A.
Figure 3C:
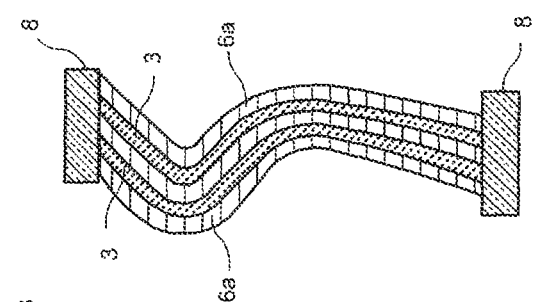
Figure 3B:
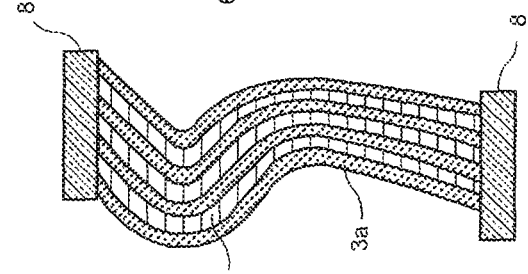
Figure 3A:
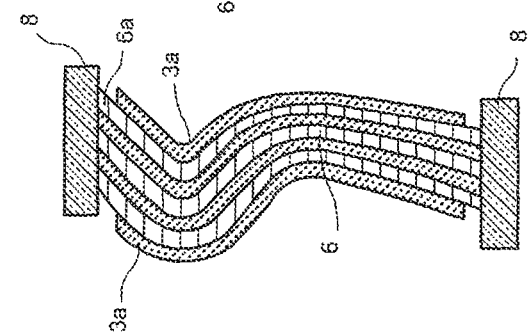
Figure 4:
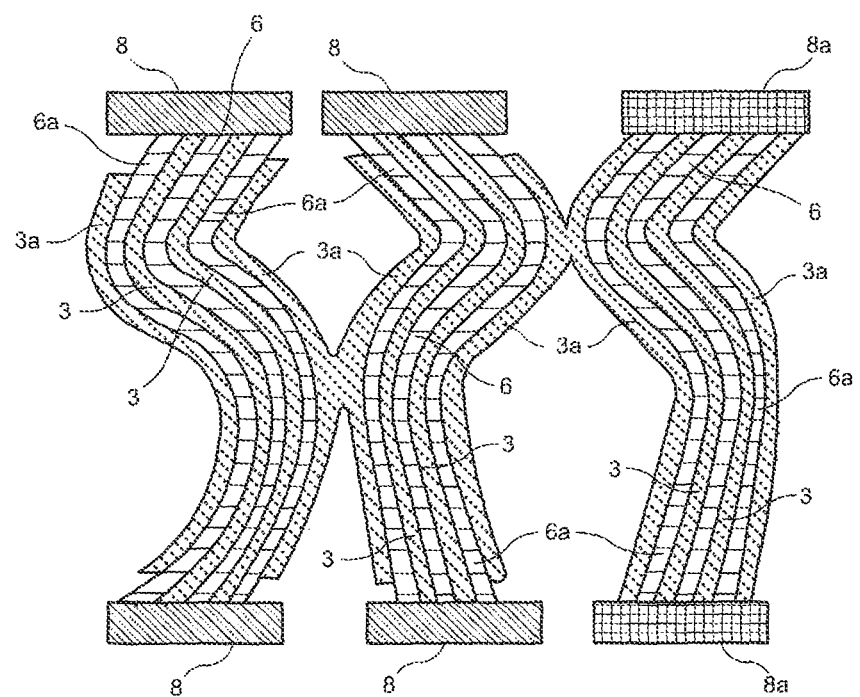
FIG. 4 is another embodiment for the present invention.
Figure 6A:
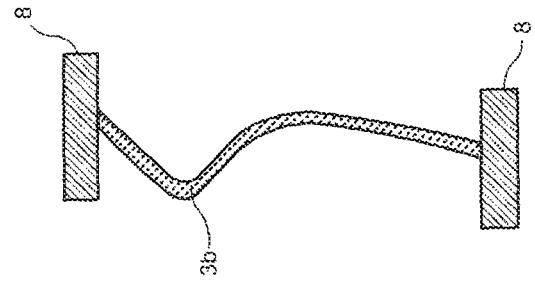
FIGS. 6a-6c shows three additional embodiments of the present invention.
Figure 6B:
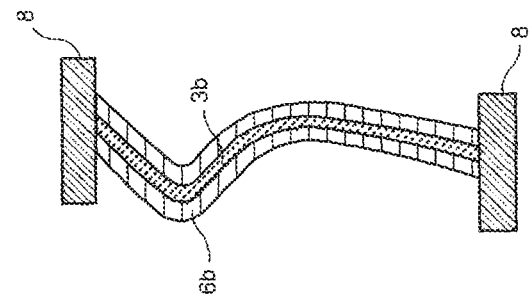
Figure 6C:
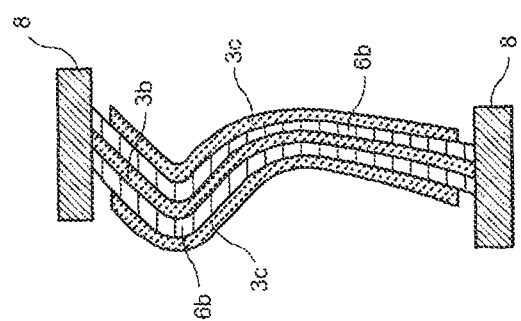

Referring now to the drawings of FIGS. 1a-14, FIG. 1a. shows a first embodiment of the present invention in which an electrical interconnect mechanism 5 forms complex connections between two or more discrete contact points 10 (such as but not limited to circuit pads 10a (FIG. 1b) or dircrete parallel circuits 8 as shown in FIG. 3a-3d, also signal pads 8 power pads 8c and ground pads 8a as shown in FIG. 4 and FIG. 13 are synonamous with discrete circuit elements 8 as well as with circuit pads 10a as shown in FIG. 1b) within two or more parallel circuit planes 7 with circuitry 6 formed in three-dimensional space between the aforementioned two or more circuit planes 7 in order to provide for electrical coupling of two or more electrical devices 8 FIG. 1b through the interconnect device 5.

As shown FIG. 1a, three-dimensionally routed dielectric wires 6 are formed between discrete points 10 on the two or more parallel circuit planes 7. These wires 6 may be freely routed in three-dimensional space to create the most efficient routing between the two arbitrarily defined points 10 on the two or more parallel circuit planes 7.

The outer surfaces of these three dimensional dielectric wires 6 prior to electrically coupling the discrete wires 6 to their respective discrete contact points 10 should be metalized 3 (see FIG. 2). Optionally, the three dimensional dielectric wires 6 (FIG. 2) may be either solid metal wires 3b (FIG. 6a) with an optional coating of dielectric 6b (FIG. 6b) as well as an optional coating of metallization on the dielectric 3c (FIG. 6c) or may be a metalized dielectric 3 (FIG. 3d) with a second coating of dielectric 6a (FIG. 3c) or may also include a second coating of dielectric 6a (FIG. 3b) and a second coating of metallization 3a (FIG. 3b). Two or more of these wires 6 (FIG. 2c) may be placed into intimate contact with one another electrically coupling each other as well as two or more discrete contact pads 10a (FIG. 2c). These electrically coupled contact pads 10a may be on opposite sides (FIG. 2a) or on the same side (FIG. 2b) of the structure 5 (FIG. 1a). Optionally, a second coating of dielectric 6a may be formed on the metalized surfaces of the discrete wires 6 to a specific thickness so as to approximate a coaxial wire (SEE FIGS. 3a-3b). These formed and metalized dielectric wires may be electrically coupled through the metallization process to discrete metallic circuits on the two or more planes 7 as in (FIG. 3c) or the discrete parallel circuits 8 (FIG. 3d) may be formed as an integral part of the formed dielectric wires 6 and then metalized along with the dielectric wires 6 (see FIG. 3d).

In the embodiment for the optionally formed second coating of dielectric 6a and metallization 3a of the wires 6 the second metallization 3a on the coated wire 6 is limited to just short of making contact to the discrete circuit elements on either plane 7 (FIG. 3a). This metallization should be recessed from the discrete circuit elements in the range of 1 um to 50 um (See FIG. 3a embodiment of the present invention).

In another embodiment of the present invention the second metalization coating and or the second dielectric layer on the formed dielectric wires is in intimate contact with one another coupling the outer metallization electrically to each other as well as to one or more points on the outer surface circuit planes. This will have the effect of providing ground shielding and or coaxial wires (See FIG. 4).

In lieu of ground shielding formed around the discrete circuit wires 6, alternatively a dielectric wall 15 or plane 15 may be formed in the z-axis or vertically in the structure, transposed between the outer surface circuit planes 7, metalized with the end points electrically coupled to the discrete circuits patterns 8,8a (FIG. 5a) on one or both planes. Tying these vertical planes to ground 8a will provide for shielding of adjacently routed circuit wires as well as the ability to control the impedance of these wires as shown in FIGS. 5a and 5b.

Figure 7A:
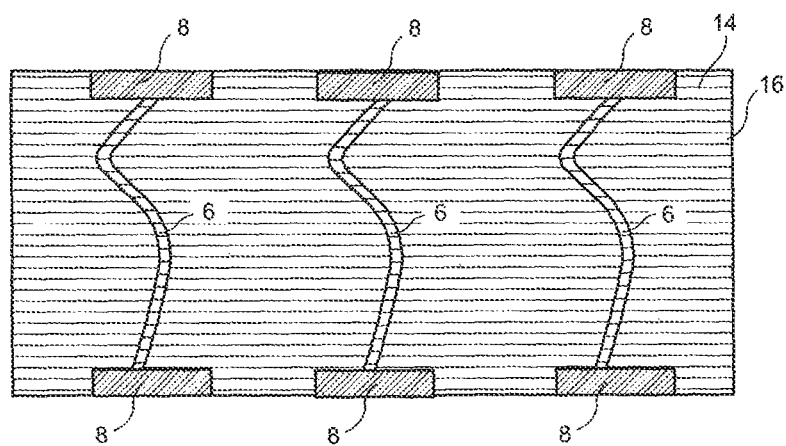
FIG. 7a shows another embodiment of the present invention in which the present invention has a rigid body formed between two or more circuit planes and is filled with a dielectric wherein the fill material extends to the top of the circuit elements.
Figure 7B:
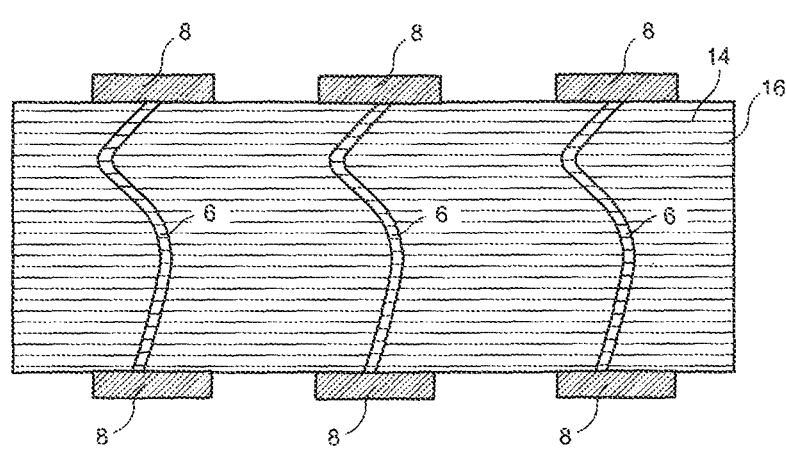
FIG. 7b shows another embodiment of the present invention in which the present invention has a rigid body formed between two or more circuit planes and is filled with a dielectric wherein the fill material extends to the bottom of the circuit elements.

FIGS. 7a and 7b shows two embodiments in which a rigid body 16 is formed between these two or more circuit planes 7 by filling the area between the planes with a dielectric 14, such as but not limited to epoxy. This fill material 14 may extend to the bottom of the circuit elements (see FIG. 7b) making the elements superior to the filled dielectric or to the top of the circuit elements (see FIG. 7a) making the elements flush to the fill material.

Figure 8:
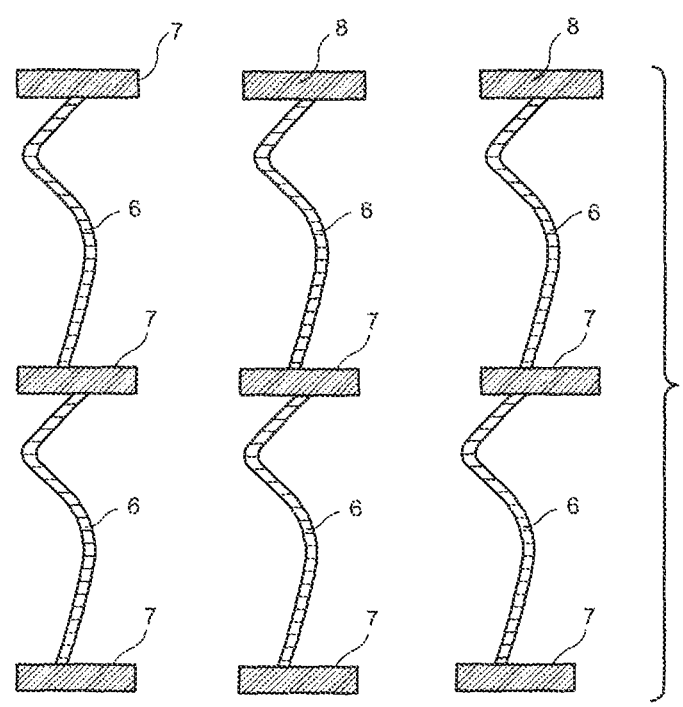
FIG. 8 is another embodiment of the present invention in which one of the circuit planes of the interconnect of the present invention acts as a plane for the next sequentially build-up plane connected by the formed wires.

Repeating one or more of the previously described processes of the previously described embodiments with one of the circuit planes 7 of the previously formed interconnect 1 acting as one of the planes for the next sequentially formed build-up circuit plane 7 connected by these formed wires 6 (See the embodiment of FIG. 8).

Figure 9:
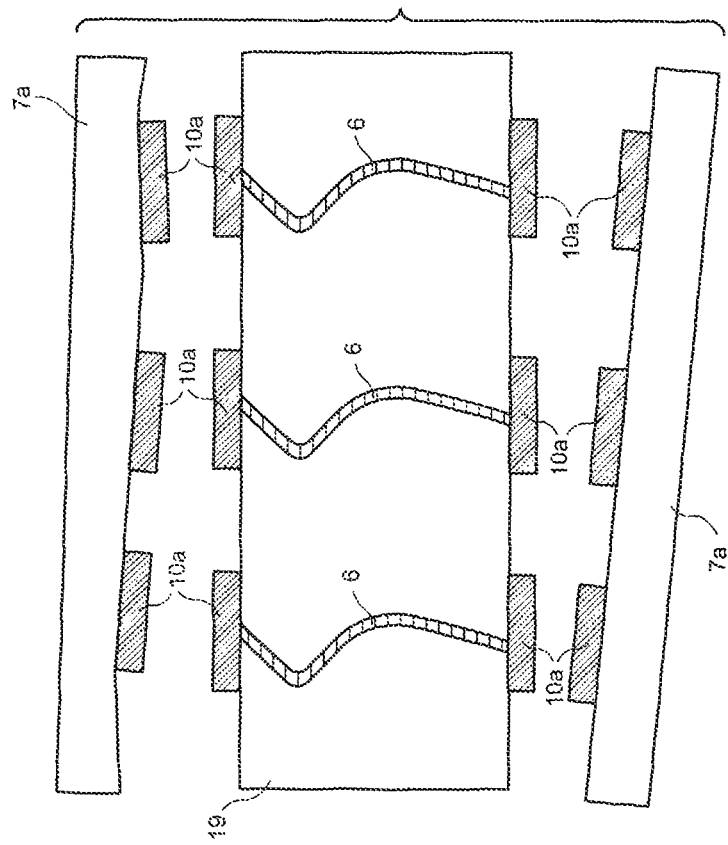
FIG. 9 is another embodiment of the present invention showing anon-coplanar interconnect.

FIG. 9 shows another embodiment of the present invention in which instead of filling the aforementioned interconnect mechanism 1 with rigid material such as epoxy 14, the interconnect structure 1 is filled with a compliant material such as an elastomer 19 to maintain alignment of the three dimensional wires 6 and circuitry end points to their desired location as well as allowing for z-axis compliance in order to allow for electrical coupling of two non-coplanar surfaces 7a intended to be coupled by said electrical interconnect mechanism 1.

FIG. 10 shows another embodiment of the present invention in which instead of filling the entire internal area of the interconnect mechanism with an epoxy, forming a scaffolding 17a with the least amount on material, such as an epoxy, in intimate contact with each of the circuit element on each of the planes transposed between both circuit planes maintaining the z-axis spacing between each plane as well as the x-y location of each of the circuit elements. This scaffolding structure will provide the interconnect 1 with a rigid structure while maintaining air around the formed circuits wires.

Figure 11A:
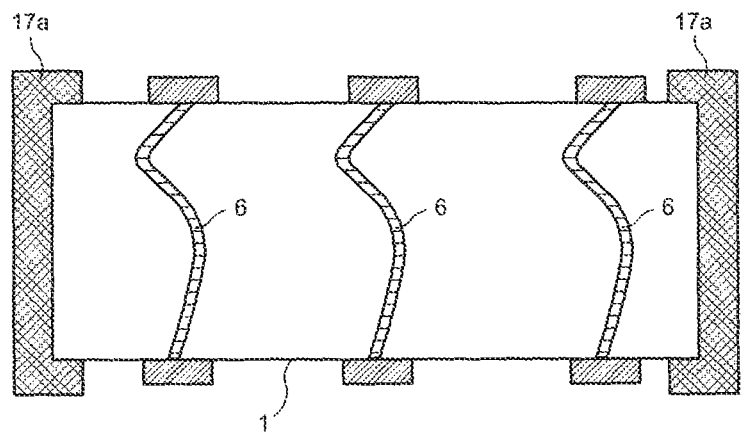
Figure 11B:
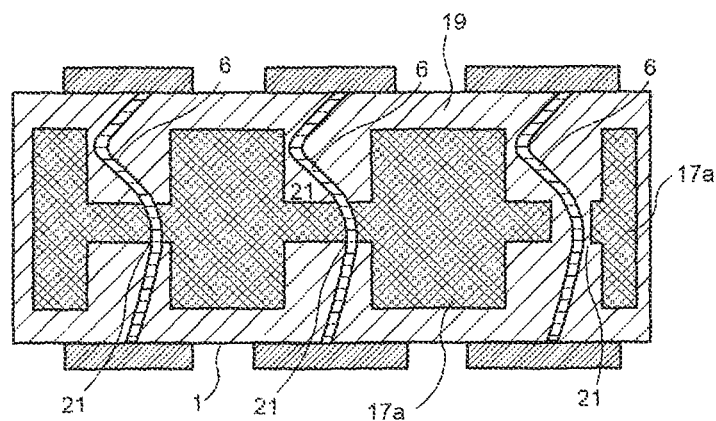
FIG. 11b is another embodiment of the present invention in which the interconnect is provided with a scaffolding of dielectric, dielectric posts or a dielectric block with penetrations for passage of the wires there through and showing the interconnect structure when filled with an elastomeric material the scaffolding of dielectric, dielectric posts or a dielectric block with penetrations for passage of the wires there through providing a fixed compression stop of the interconnect structure.

FIG. 11a shows another embodiment of the present invention in which around said interconnect a scaffolding of dielectric, dielectric posts or a solid dielectric block 17a. FIG. 11b shows a similar embodiment of the present invention but with said scaffolding of dielectric, dielectric posts or a solid dielectric block with penetrations 21 provided to permit entry of the wires 6. When used in conjunction with a filled elastomeric material, said dielectric structure provides a fixed compression stop of the interconnect structure 1 to prevent damage to the wires 6 due to over compression (FIG. 11b).

Designing the free flow of the three dimensionally formed aforementioned wires to have shapes such as but not limited to coils, cantalievers, and S-shapes to provide spring like characteristics to allow for the compliance of the wires while resisting stress cracking in the metal and or dielectric (See FIG. 1a).

Figures 12A, 12B, 12C:
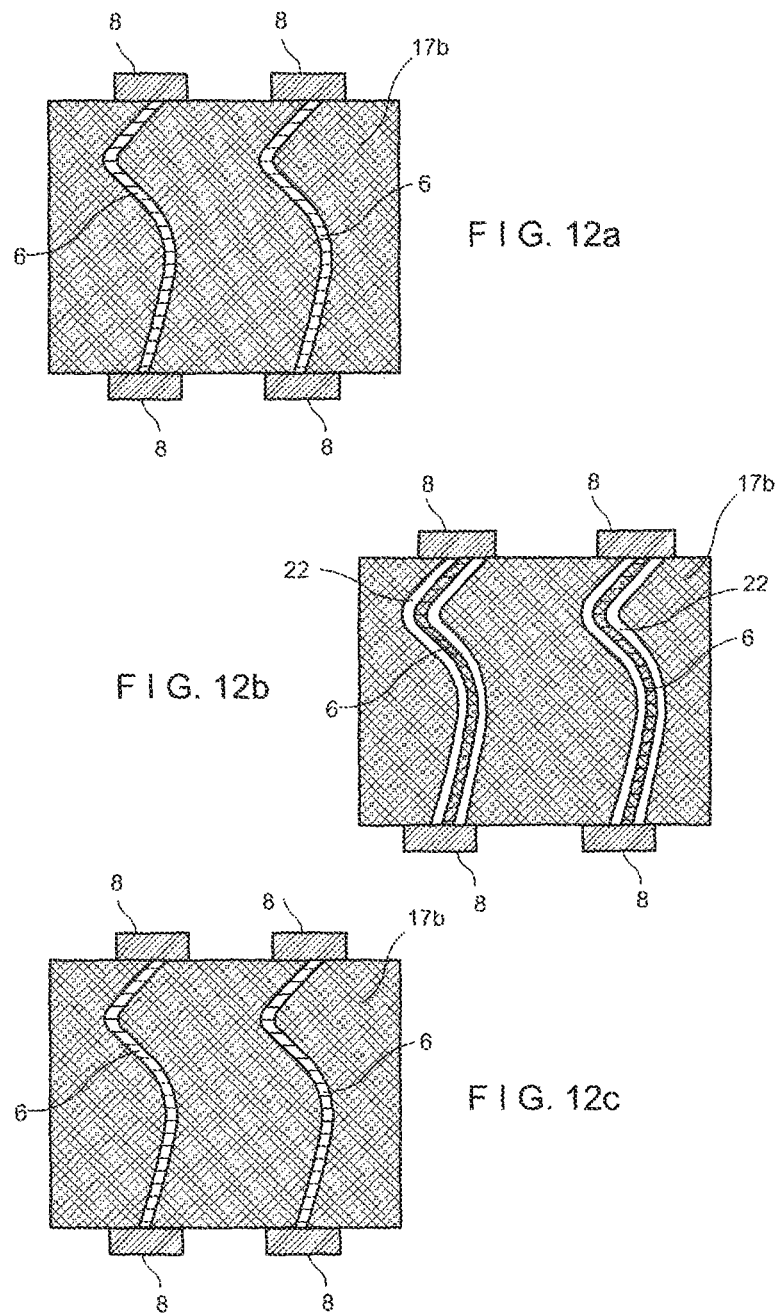

FIG. 12a shows another embodiment of the present invention in which a lattice work of non-conductive dielectric scaffolding 17b transposed between the two circuit planes 7 in intimate contact to the circuit elements within the circuit planes 7 is provided which both provides for alignment of the individual contact points or circuit elements 10 within the circuit planes 7 and either providing rigidity for the entire structure 1 or allowing for some compliance of the entire structure in the z-axis, while optionally also allowing for air dielectric 22 around the aforementioned wires (See FIG. 12b). FIG. 12a shows the embodiment with the circuit elements superior to the dielectric and FIG. 12c shows the embodiment with the circuit elements flush. The scaffolding can be of varying structures known in the art of mechanical engineering to provide the desired properties described above.

FIG. 13 shows affixing and electrically coupling two or more terminal points 24 of a electronic component 23 such as but not limited to a resistor, capacitors or inductor to the formed wires and the corresponding circuit elements of the corresponding planes 7. Each point to be coupled to its corresponding designated power, ground, or signal wires 6 and or circuit elements 10 in the interconnect structure 1. In this way capacitance, resistance, inductance, or any other electronic function is provided to the points of the electrical devices the interconnect 1 is intended to couple. (See FIG. 13)

FIG. 14 shows another embodiment of the present invention in which the wires 6 are extended beyond the rigid body of the interconnect 1 with shape such as but not limited to coils, cantalievers, and S-shapes to provide spring like characteristics to allow for the compliance of the wires while resisting stress cracking in the metal and or dielectric and end points conducive for contacting various shapes of electrical devices such as but not limited to sharp points, crown tips or cup shapes 25 acting as a compliant interconnect coupling two non-coplanar electrical devices. Providing the ability for pitch translation and pin remapping as well as compliant probing in one integrated structure.

Further each of the aforementioned embodiments of the present invention can be built with one or more silicon wafer ICs' creating multi chip modules interconnecting the two or more ICs' where a silicon layer is the base circuit plane.

Further each of the aforementioned embodiments of the present invention can be built with one or more silicon wafer ICs' creating redistribution packaging for the IC.

Further each of the aforementioned embodiments of the present invention can be built on a flexible circuit base.

The method for the above described embodiment structure is as follows:

In the case of a trace anywhere interconnect with dielectric core wires for the present invention, the starting point is with a flat carrier of glass, ceramic or some other smooth, flat material such as but not limited to s smooth metallic block. Next one should temporarily bond a sheet of metallic foil preferably Cu to the flat material carrier to keep the Cu flat with a suitable bonding material such as but not limited to adhesive or wax. This foil thickness should be in the range but not limited to 10 um to 35 um. Next, on top of the Cu foils, utilizing commercially available 3D printing techniques know in the art, form dielectric wires attached to the Cu foil grow-up from predetermined locations on the foil to predetermined location in free space in the z axis. The foil may be treated to promote adhesion of the dielectric wires through micro-etching plasma or other surface treatment known in the art. These wires will typically be in the range of 1 um to 50 um in diameter. These wires will be built up to a z-axis height approximately 25 um to 100 um above the overall height of the planned interconnect mechanism typically from 100 um to 0.200" thick.

Next, the free formed wires extending from the Cu sheet are metalized with electro-plating, electro-less plating. Chemical vapor deposition, sputter coating or any other technique known in the art. The thickness of this metallization will typically be in the range of 1 um to 25 um. This metallization will in effect coat the dielectric wires as well as the exposed surface area of the base foil making the base foil and the coated wires electrically coupled.

Optionally, the metalized dielectric wires can be coated again with a dielectric via a dip operation, silicon Chemical Vapor deposition (SCVD) Silica Pulsed layer Deposition (PLD), Titania Atomic Layer Deposition (ALD) or other techniques known in the art. During this process the top side, of the base foil metallization can be coated as well, electrically isolating it from further processes.

The coated wires are then (optionally) metalized via the techniques previously described. This metallization will have the effect of shorting all the surfaces of the formed wires together. Tying this metallization to one or more ground wires or outer circuit layers in effect creates ground shielding for all wires as well as approximates coaxial wires for all signal wires. Coupling this ground metallization can be achieved through selective removal of the outer coating of dielectric, via laser ablation, Milling or some other technique known in the art, from the wires or areas of the base copper designed to be ground when the interconnect ultimately couples two or more electronic devices.

Now that the wires are formed with or without a second dielectric and second metallization the structure can be filled with a dielectric such as but not limited to epoxy via a molding operation (commonly known in the art) curing the epoxy into a rigid substrate. It would be best to over mold the epoxy beyond the top end points of the formed wires by approximately 25 um-100 um. This permits enough material for a planarization process via grinding, sanding, lapping or other techniques know in the art.

In the embodiment of the wires having a second dielectric and second metallization the top tips of the wires may be coated with a temporary coating such as wax or a temporary polymer to prevent metallization from forming at the last 25 um to 100 um (typically) on the second dielectric layer.

Planarization also reveals the tops of the metalized wires providing the opportunity to build up a second circuit layer while electrically coupling said circuit layer to the wires and the base foil. If the tips of the coated wires have been spared from secondary metallization then carefully controlling the planarization of the interconnect substrate in the z-axis will reveal the first metalized layer of the formed wire exposing it to be electrically coupled to the aforementioned second circuit plane formation without coupling the aforementioned optional second metallization of the formed wire to the second circuit plane layer.

The aforementioned second circuit plane layer can then be formed via electro-less plating, Chemical vapor deposition, sputter coating, electro-plating, or any other technique known in the art. This conductive metallization is preferably Cu, Au or any other suitable conductive material and or multiple layers of different materials.

After lifting the interconnect off the smooth substrate. The primary bottom metallic layer, and the secondary top layer may now be formed into discreet circuitry through a traditional photo lithographic etching processes known in the art. The contact points or pads formed through this circuitization process can be additionally plated with suitable metallic alloys for the desired application such as but not limited to wear resistance or solder-ability.

Alternatively, in lieu of a dielectric core in the aforementioned wires a metal core may be substituted through the use of negative 3D printing techniques utilizing but not limited to negative working photo sensitive epoxy known in the art whereby a temporary dielectric is formed through the entire active area of the interconnect except where the core wire metallization is to be formed. Then the metallization is formed through electro-plating, electro-less plating, Chemical vapor deposition, sputter coating or other techniques known in the art to form a sold metallic wire structure. Alternatively, varying metals of varying thicknesses can be formed on the inner walls of the voided structures in the epoxy layers providing the desirable electrical and mechanical properties for the end application. Then the temporary epoxy is removed through stripping techniques known in the art and freestanding metallic wires or tubes remain for continued processing described above.

Alternatively, dielectric cored, metallic cored or metallic tubes with or without additional layers of dielectric and metallization for shielding or coaxial vias could be formed on to discrete metallic pads or circuits pre-formed on to said smooth glass or smooth ceramic or other suitable material through electro-plating, electro-less plating. Chemical vapor deposition, sputter coating or any other technique known in the art. Having their dimensions defined through a temporary photo-lithographic process common in the art. Further, these pads or circuits could be formed utilizing a laser stenciling process whereby a metallic foil is adhered temporarily to the smooth flat base material with an adhesive or wax and the aforementioned techniques for wire formation may be build on top of the discrete pads or circuitry.

Further when the end points of the formed wires are formed discrete pads and or circuitry with varying geometric shapes may be formed based on the intended application of the inter-connect. Solder-able pads or pins of varying shapes for making contact to electrical terminals may be formed and metalized as described previously. This formation and metallization of the end points of the formed wires in one step saves additional processing time and in combination with the formation of the discrete pads on the base metal layer provides the opportunity for flush circuit pads on both ends on the inter-connect once the aforementioned epoxy molding process in completed.

Alternatively, in any of the embodiments described above an elastomer or rubber compound potting material may be substituted for a rigid potting compound providing the interconnect terminals with compliance for mating non-coplanar electronic device surfaces. By varying the durometer of the potting material as well as the formed wires material, thickness, length and shape we may control the total amount of compliance, force and longevity of each of the formed wire mating terminals.

Alternatively, in the event of an aforementioned compliant interconnect a latticework, posts, or a solid block of a suitable hard material such as but not limited to epoxy may be formed within the open spaces of the inter-connect not occupied by the formed wires or the compliant potting material. These structures can be formed through the same 3D printing techniques, in the open spaces of the interconnect body, with a height slightly thinner than the overall thickness of the interconnect (~10 um to 200 um) providing the interconnect structure with a hard compression stop against the two mating surfaces of the devices intended to be electrically coupled. This will prevent over compression and damage of the interconnect structure.

While presently preferred embodiments have been described for purposes of the disclosure, numerous changes in the arrangement of method steps and those skilled in the art can make apparatus parts. Such changes are encompassed within the spirit of the invention as defined by the appended claims.

What is claimed:

1. A method for forming an electrical interconnect mechanism comprising:
   providing two or more discrete contact points such as but not limited to circuit pads within two or more circuit planes; and
   freely routing with three-dimensional dielectric wires between said discrete points on said two or more circuit planes, said discrete points located anywhere along either side of each of said two or more circuit planes in order to provide electrical coupling of two or more electrical devices through said interconnect mechanism and to provide free routing of said wires, said dielectric wires having an electrically conductive coating and said discrete points including contact pads and said two or more wires being placed in intimate contact on each of the electrodes coupling each other as well as to two or more of said discrete contact pads.

2. The method according to claim 1 wherein said circuit planes are substantially parallel to each other.

3. The method according to claim 1 further comprising metallizing outer surfaces of said dielectric wires electrically that couple to their respective discrete contact points with any any conductive material organic or inorganic.

4. The method according to claim 3 wherein said conductive material is copper, silver, gold, or conductive polymer.

5. The method according to claim 1 wherein said electrically coupled contact pads may be on opposite sides or on a same side of the structure and the formed metalized wires may originate on one side and terminate on the other or originate and terminate from the same side.

6. The method according to claim 1 wherein a second coating of dielectric is formed on metalized surfaces of the discrete wires to approximate a coaxial wire.

7. The method according to claim 6 wherein the formed second coating of dielectric and metallization of the wires, the second metallization on the coated wire is limited to just short of making contact to the discrete circuit elements on either of said planes.

8. The method according to claim 7 wherein said metallization is recessed from the discrete circuit elements in a range of 1 um to 50 um.

9. The method according to claim 1 wherein said formed and metalized dielectric wires are electrically coupled through the metallization process to discrete metallic circuits on the two or more planes or the discrete parallel circuits are formed as an integral part of the formed dielectric wires and then metalized along with the dielectric wires.

10. The method according to claim 1 further comprising the steps of:
   forming adjacent to the discrete circuit wires, a dielectric wall or plane in the z-axis or vertically in the structure instead of forming ground shielding around the discrete circuit wires, transposed between the outer surface circuit planes, metalized with the end points electrically coupled to the discrete circuits patterns on one or both planes.

11. The method according to claim 10 further comprising the steps of tying these vertical planes to ground to provide for shielding of adjacently routed circuit wires as well as the ability to control the impedance of these wires.

12. The method according to claim 1 wherein said wires are formed with a core of metal in lieu of dielectric and then a dielectric is coated on them.

13. The method according to claim 12 wherein after said wires are formed with a core of metal in lieu of dielectric and a dielectric is coated on them and it is then metalized.

14. The method according to claim 1 wherein a rigid body is formed between said two or more circuit planes by filling an area between the planes with a dielectric.

15. The method according to claim 14 wherein said dielectric includes epoxy and air.

16. The method according to claim 14 wherein said dielectric is epoxy.

17. The method according to claim 14 wherein said fill material extends to a bottom of the circuit elements making the elements superior.

18. The method according to claim 14 wherein said fill material extends to a top of the circuit elements making the elements flush to the fill material.

19. The method according to claim 14 wherein said aforementioned process is repeated with one of the circuit planes of the previously formed interconnect acting as one of the planes for a next sequentially formed build-up circuit plane connected by said formed wires.

20. The method according to claim 1 wherein a compliant body is formed between said two or more circuit planes by filling an area between the planes with a compliant material to provide alignment of the three dimensional wires and circuitry end points to their desired location as well as allowing for z-axis compliance in order to allow for electrical coupling of two non-coplanar surfaces intended to be coupled by said electrical interconnect mechanism.

21. The method according to claim 20 wherein said complaint material is an elastomeric material.

22. The method according to claim 1 wherein a scaffolding is formed in or around the interconnect with a least amount of material in intimate contact with each of the circuit elements on each of the planes transposed between both circuit planes maintaining the z-axis spacing between each plane as well as the x-y location of each of the circuit elements, said scaffolding structure providing the interconnect with a rigid structure while maintaining a greater amount of air around the formed circuits wires.

23. The method according to claim 22 wherein the greater amount of air can range between 1% and 99% more air than solid epoxy fill within area between said circuit elements.

24. The method according to claim 22 wherein said least amount of material is epoxy.

25. The method according to claim 1 wherein there is within or around said interconnect a scaffolding of dielectric, dielectric posts or a solid dielectric block short of the z axis height of the parallel circuit planes wherein penetrations are provided in said scaffolding to permit entry of the wires so that when used in conjunction with a filled elastomeric material, said dielectric structure provides a fixed compression stop of the interconnect structure to prevent damage to the wires due to over compression.

26. The method according to claim 1 wherein said wires are configured as a free flow of the three dimensionally formed wires by being formed with S curves, cantilevered shapes or coiled shapes to allow for the compliance of the wires while resisting stress cracking in the metal and or dielectric.

27. The method according to claim 1 wherein a lattice work of non-conductive dielectric scaffolding transposed between the two circuit planes in intimate contact to the circuit elements within the circuit planes is provided which both provides for alignment of the individual contact points or circuit elements within the circuit planes and either providing rigidity for the entire structure or allowing for some compliance of the entire structure in the z-axis, while also allowing for air dielectric around the aforementioned wires.

28. The method according to claim 1 further comprising the steps of affixing and electrically coupling two or more terminal points of a electronic component to the formed wires and the corresponding circuit elements of the corresponding planes, each point being coupled to its corresponding designated power, ground, or signal wires and or circuit elements in the interconnect structure in this way the electronic component's function is provided to the points of the electrical devices the interconnect is intended to couple.

29. The method according to claim 28 wherein said electronic component is a capacitor.

30. The method according to claim 28 wherein said electronic component is a resistor.

31. The method according to claim 28 wherein said electronic component is an inductor.

32. The method according to claim 28 wherein the electronic components terminal points are coupled to its corresponding power, ground or signal wires in the interconnect structure so that said component terminal points are provided to the points of the electrical devices the interconnect is intended to couple.

33. The method according to claim 1 wherein said wires extend beyond a rigid body of the interconnect with shapes conducive for flexing and end points conducive for contacting various shapes of electrical devices acting as a compliant interconnect coupling two non-coplanar electrical devices providing the ability for pitch translation and pin remapping as well as compliant probing in one integrated structure.

34. The method according to claim 1 wherein said interconnect structure is built with one or more silicon wafer ICs' creating multi chip modules interconnecting the two or more ICs' where a silicon layer is the base circuit plane.

35. The method according to claim 1 wherein said interconnect structure is built with one or more silicon wafer ICs' creating a redistribution packaging for the IC.

36. The method according to claim 1 wherein said interconnect structure is built on a flexible circuit base.

* * * * *

UNITED STATES PATENT AND TRADEMARK OFFICE
CERTIFICATE OF CORRECTION

PATENT NO. : 10,257,930 B2
APPLICATION NO. : 15/189435
DATED : April 9, 2019
INVENTOR(S) : Thomas P. Warwick, Dhananjaya Trupuseema and James V. Russell Page 1 of 1

It is certified that error appears in the above-identified patent and that said Letters Patent is hereby corrected as shown below:

On the Title Page

Please correct the Inventor's name to read as follows:
(72) Dhananjaya Turpuseema Signed and Sealed this
Thirteenth Day of August, 2019

Andrei Iancu
*Director of the United States Patent and Trademark Office*